United States Patent [19]
Riley et al.

[11] 4,329,580
[45] May 11, 1982

[54] FIBER OPTIC, LIQUID CRYSTAL DISPLAY ELECTRICAL MEASUREMENT SYSTEM

[75] Inventors: Leon H. Riley; George R. Edlin, both of Huntsville, Ala.

[73] Assignee: The United States of America as represented by the Secretary of the Army, Washington, D.C.

[21] Appl. No.: 181,317

[22] Filed: Aug. 25, 1980

[51] Int. Cl.³ .............................................. G01R 31/00
[52] U.S. Cl. ..................................... 250/215; 324/95; 324/96
[58] Field of Search ..................... 250/215; 324/95, 96

[56] References Cited
U.S. PATENT DOCUMENTS
4,247,858 1/1981 Eichweber .......................... 343/721

Primary Examiner—David C. Nelms
Assistant Examiner—Darwin R. Hostetter
Attorney, Agent, or Firm—Nathan Edelberg; Robert P. Gibson; Robert C. Sims

[57] ABSTRACT

The electromagnetic energy is captured by the antenna and changes the reflectivity of a Liquid Crystal Display (LCD) proportional to the field being measured. The LCD is illuminated by a fiber optic and this light is reflected from LCD proportional to the electromagnetic field. This field proportional light is captured by a fiber optic and transmitted to a photodetector where it is converted to an electrical signal proportional to the electric field. This electrical signal may then be displayed, recorded or processed with other information.

5 Claims, 1 Drawing Figure

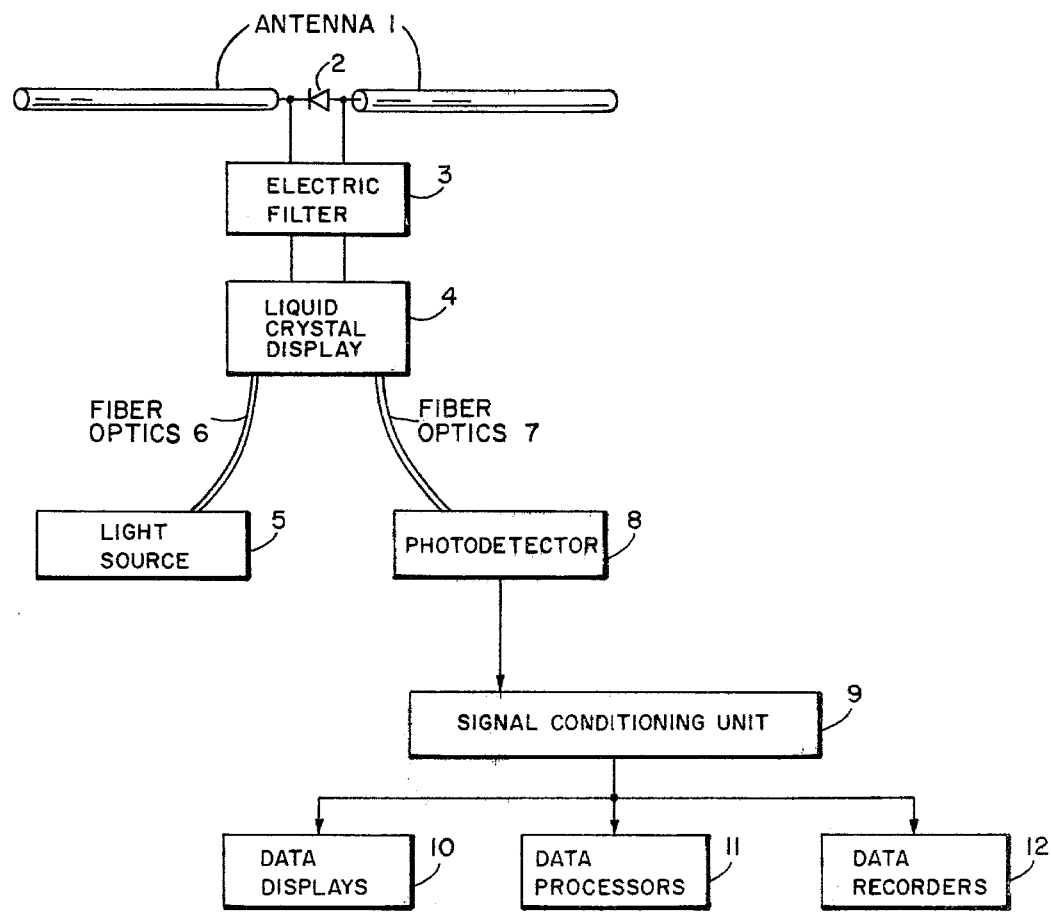

FIBER OPTIC, LIQUID CRYSTAL DISPLAY ELECTRICAL MEASUREMENT SYSTEM

DEDICATORY CLAUSE

The invention described herein may be manufactured, used, and licensed by or for the Government for governmental purposes without the payment to us of any royalties thereon.

BACKGROUND OF THE INVENTION

In current art the electromagnetic field intensity measuring systems utilize electrical conductors interconnecting the antenna with the metering unit. This results in field perturbations and electrical interference caused by the leads interconnecting the antenna to the metering unit. The metering unit may be located at the antenna but this normally results in a cumbersome package due to batteries and manual reading at the antenna is required. This patent provides for interconnecting the antenna and metering by means of nonconductive fiber optics.

SUMMARY OF THE INVENTION

This patent provides for interconnecting the antenna and metering by means of nonconductive fiber optics. The electromagnetic energy captured by the antenna changes the reflectivity of a Liquid Crystal Display (LCD) proportional to the field being measured. The LCD is illuminated by a fiber optic and this light is reflected from LCD proportional to the electromagnetic field. This field proportional light is captured by a fiber optic and transmitted to a photodetector where it is converted to an electrical signal proportional to the electric field. This electrical signal may then be displayed, recorded or processed with other information.

BRIEF DESCRIPTION OF THE DRAWING

The single drawing is a block diagram illustration of the present invention.

DESCRIPTION OF THE BEST MODE AND PREFERRED EMBODIMENT

Field intensity (FI) measurement system in the past required (1) electrical cable connection of an antenna to an electrical level indicating unit or (2) the electrical level indicating unit to be a part of the antenna. The utilization of electrical cables (Case 1) causes disturbances of the fields being measured. Locating the electrical level indicating unit at the antenna (Case 2) requires that the operator be located at the equipment to take the reading. The operator's body and this equipment can cause disturbances in the fields and the physical size of the equipment limits it's utilization.

The single figure shows the construction of the system. Electrical energy is captured from the electromagnetic field being measured by the antenna 1. The electrical energy is converted to a direct current voltage by the diode 2 and the electric filter 3. This direct current potential is applied to the Liquid Crystal Display 4 (LCD) and changes the reflectivity of the display proportional to the electromagnetic field being measured. The LCD is illuminated by a light source 5 transmitted to the LCD through fiber optic 6. The amount of light reflected from the LCD is proportional to the electromagnetic field. The light is gathered by the fiber optics 7 and transmitted to a photodetector 8. The photodetector converts the light intensity that is proportional to the field being measured into an electrical signal that is proportional to the field being measured. The photodetector output is transmitted to signal conditioning 9 to make this electrical signal compatible to displays 10, processors 11 or recorders 12.

Electrical filters 3 can be any of the well known filter systems for converting AC energy into DC. The Liquid Crystal Display 4 could take the shape of any of the well known Liquid Crystal devices which have an output reflectivity proportional to a direct current input.

Photodetector 8 can take the shape of any well known devices which convert optical energy into electrical energy. For example a photovoltage cell which has a voltage output proportional to the light received thereby. The signal conditioned unit 9 can take the shape of any of the well known analog digital converters or any kind of converter that may be necessary for the particular output indicators attached thereto.

One of the advantages over present field intensity measurement systems is the low power requirements. The field intensity measuring antenna captures electrical energy from the field being measured. This captured electrical energy is delivered to the liquid crystal display which provides a change in reflectivity proportional to the electrical energy applied. Since light is delivered to the LCD by fiber optics to be reflected from the LCD, no electric batteries or generators are required at the antenna.

Another advantage of this system is electrical isolation of the measuring antenna from metering system. Electrically nonconductive fiber optics are used to illuminate the LCD and to pass the reflected light to the metering system. This electrical isolation of the antenna and it's small size will enable measurements of electromagnetic fields in small volumes. These measurements have been virtually impossible to do with accuracy prior to this technique. The nonconductive leads will not disturb the electromagnetic field being measured and electrical interference will not be introduced into the metering system. This field perturbation and electrical interference problem exists in present electromagnetic field intensity measuring systems.

We claim:

1. A testing device comprising antenna means for detecting the intensity of a field to be measured; conversion means for converting an output of the antenna into a DC output; a liquid crystal having its inputs connected to said DC outputs so as to change reflectivity of the crystal in accordance with the value of the DC output; a light means positioned relative to the crystals so as to direct light thereon; transmitting means positioned relative to the crystal so as to detect light that is reflected off of said crystal; and a detector means connected to said transmitting means to receive the light reflected from said liquid crystal.

2. A testing device as set forth in claim 1 wherein said transmitting means is a fiber optics of such length that the detector means is located remote from said antenna.

3. A testing device as set forth in claim 2 further comprising a second fiber optics positioned between said light means and said liquid crystal so as to allow said light means to be located remote from said liquid crystal.

4. A testing device as set forth in claim 1 or 3 wherein said detector means is a photodetector having an output proportional to the intensity of the field to be measured.

5. A testing device as set forth in claim 4 wherein said fiber optics are nonconductive with respect to the electromagnetic frequency range of field to be measured.

* * * * *